United States Patent [19]
Sato et al.

[11] Patent Number: 5,449,591
[45] Date of Patent: Sep. 12, 1995

[54] METHOD FOR MANUFACTURING A CURVED SURFACE MULTI-LAYER WIRING BOARD

[75] Inventors: Masahito Sato; Kazuaki Tajima; Yoshio Matsuda; Takahumi Miyamoto, all of Kanagawa, Japan

[73] Assignee: Mitsubishi Denki Kabushiki Kaisha, Tokyo, Japan

[21] Appl. No.: 111,110

[22] Filed: Aug. 24, 1993

Related U.S. Application Data

[63] Continuation-in-part of Ser. No. 841,319, Feb. 25, 1992, abandoned.

[30] Foreign Application Priority Data

Mar. 6, 1991 [JP] Japan .................................. 3-040048
Oct. 15, 1991 [JP] Japan .................................. 3-266153

[51] Int. Cl.$^6$ .............................................. G03F 7/24
[52] U.S. Cl. ......................... 430/313; 430/318; 430/327; 430/330; 428/901; 216/20
[58] Field of Search ............ 430/311, 313, 318, 327, 430/330; 174/254, 266; 156/629, 632, 634, 643, 659.1; 428/901

[56] References Cited

U.S. PATENT DOCUMENTS

| | | | |
|---|---|---|---|
| 3,799,802 | 3/1974 | Schneble | 205/126 |
| 4,106,187 | 8/1978 | Smith | 29/625 |
| 4,258,468 | 3/1981 | Balde | 29/830 |
| 4,388,388 | 6/1983 | Kornbau | 430/313 |
| 4,521,262 | 6/1985 | Pellegrino | 430/313 |
| 4,716,259 | 12/1987 | Tokura | 174/254 |
| 4,835,087 | 5/1989 | Bielli | 430/318 |
| 4,922,257 | 5/1990 | Saito et al. | 342/377 |

*Primary Examiner*—Kathleen Duda
*Attorney, Agent, or Firm*—Wolf, Greenfield & Sacks

[57] ABSTRACT

A method for manufacturing a curved surface multi-layer wiring board having highly accurate inner patterns with high reliability. A curved surface multi-layer wiring board is manufactured by providing and pressing a prepreg to form a curved surface, and by plating a copper film on the curved surface. Outer patterns are formed on the copper film. The outer patterns may be formed by a laser exposure process after through-holes are connected between the layers. A method is also provided for repeating the process to obtain a curved surface multi-layer wiring board which has a three dimensional curved surface.

19 Claims, 18 Drawing Sheets

METHOD FOR MANUFACTURING A CURVED SURFACE MULTI-LAYER WIRING BOARD

CROSS REFERENCE TO RELATED APPLICATION

This application is a continuation-in-part of U.S. Ser. No. 07/841,319, filed Feb. 25, 1992, now abandoned.

BACKGROUND OF THE INVENTION

The invention relates to a method for manufacturing a curved surface multi-layer wiring board used for a conformal array antenna, and a method for confirming NC (numerical control) data used for laser exposure.

FIG. 19 is a flow chart of a conventional method for manufacturing a curved surface multi-layer wiring board. In FIG. 19, 107 is a laying-up process, 112 is an inner layer connection process.

FIG. 20(a) is a side sectional view for manufacturing a curved surface multi-layer wiring board. In FIG. 20, 21 is formation mould, 22 and 23 are standard pins and standard pin acceptance holes on the above formation mould 21 respectively, 25 are separation films, 27 are inner patterns, 31 are through-holes connecting the inner patterns 27 between the layers. 45 is a flat surface multi-layer wiring board arranged on the formation mould via separation film 25.

FIG. 20(b) is a view of a curved surface multi-layer wiring board manufactured by the method shown in FIG. 20(a). In FIG. 20(b), 32 are outer patterns connected to the through-holes 31. 45b is a curved surface multi-layer wiring board.

A method for manufacturing a curved surface multi-layer wiring board is described hereinafter using FIG. 19, FIG. 20(a) and FIG. 20(b).

At first, the laying-up process (Step 107) is explained using FIG. 19. Standard holes for positioning are perforated into the inner layer copper clad laminate 1 obtained by forming a copper film on the substrate of the epoxy or polyimide series resin, the outer layer single side copper clad laminate 3 and the prepreg 4 (Step 102). Then, after exposing the inner layer copper clad laminate 1, inner layer patterns 27 are formed by developing and etching processes (Step 103). After perforating the standard holes into the outer layer single side copper clad laminates 3 and the prepregs 4, they are laid-up (Step 106) and pressed in order to obtain a pressed laminate (Step 141).

An inner layer connection process (Step 112) is explained hereinafter using FIG. 19. After manufacturing the laminate, holes are perforated into the pressed laminate (Step 142). The walls of the holes are cleaned (Step 110), then the walls of the holes are plated (Step 111) for forming through-holes 31.

An outer layer pattern 32 is then formed on the outer layer for making a flat multi-layer wiring board 45 by an exposure and etching process (Step 143).

In FIG. 20(a), the flat multi-layer wiring board 45 is set up on the formation mould 21 by aligning the standard pins 22 to the standard pin acceptance holes 23 through the hole in the flat multi-layer wiring board 45. The separation films 25 are put between the formation mould 21 and the flat multi-layer wiring board 45, then the flat multi-layer wiring board 45 is pressed by applying heat and a curved surface multi-layer wiring board 45b is obtained as shown in FIG. 20(b) (Step 144).

In the conventional method for manufacturing a curved surface multi-layer wiring board, even if the positioning of the through-holes and lands or pattern width is very precisely manufactured, there are many problems in that the copper films of the through-holes and patterns are stripped or the copper patterns are shared by the surface stress of the board since the surface formation is executed by applying heat. Also, there are other problems in that a spring back occurs after forming the laminate since the wiring board is formed to a curved shape by applying the pressure. Accordingly, it is difficult to obtain a desired shape of the curved surface multi-layer wiring board.

Also, if the surface of the curved surface multi-layer wiring board is not a two dimensional curve such as a cylindrical curved surface but instead a three dimensional curved surface such as a partial globe, the land or the pattern position of the curved multi-layer wiring board can not be simulated from the flat wiring board since the wiring board is deformed by the temperature of the press process. Therefore the lands and patterns formed at the state of the flat wiring board are shifted from the theoretical position.

In addition, when the curve surface is of an arbitrary shape which has a sharp curve in two directions, such as in a semi-sphere, wrinkles and cracks can form on the conductor surface when the copper film is pressed. Consequently, it can be difficult to manufacture a curved surface multi-layering wiring circuit board having a deep drawing or sharply curved surface.

SUMMARY OF THE INVENTION

According to the invention, a prepreg is pressed to form a curved surface, and a copper film is plated on the curved surface. Patterns are formed in the copper film, preferably by forming a resist, directing laser light, developing the resist, and etching the surface. Another prepreg can be placed against the curved surface and pressed to form a new curved surface. Another copper film may be plated on the new curved surface, and new patterns may be formed. This process of providing new prepreg, pressing, plating, and forming patterns can be repeated as many times as desired.

By plating the prepreg, a shaped wiring board can be formed with a sharp curvature, and with three dimensional variation, such as a portion of a sphere.

DETAILED DESCRIPTION OF THE PREFERRED EMBODIMENTS

First Embodiment

Figure 1:
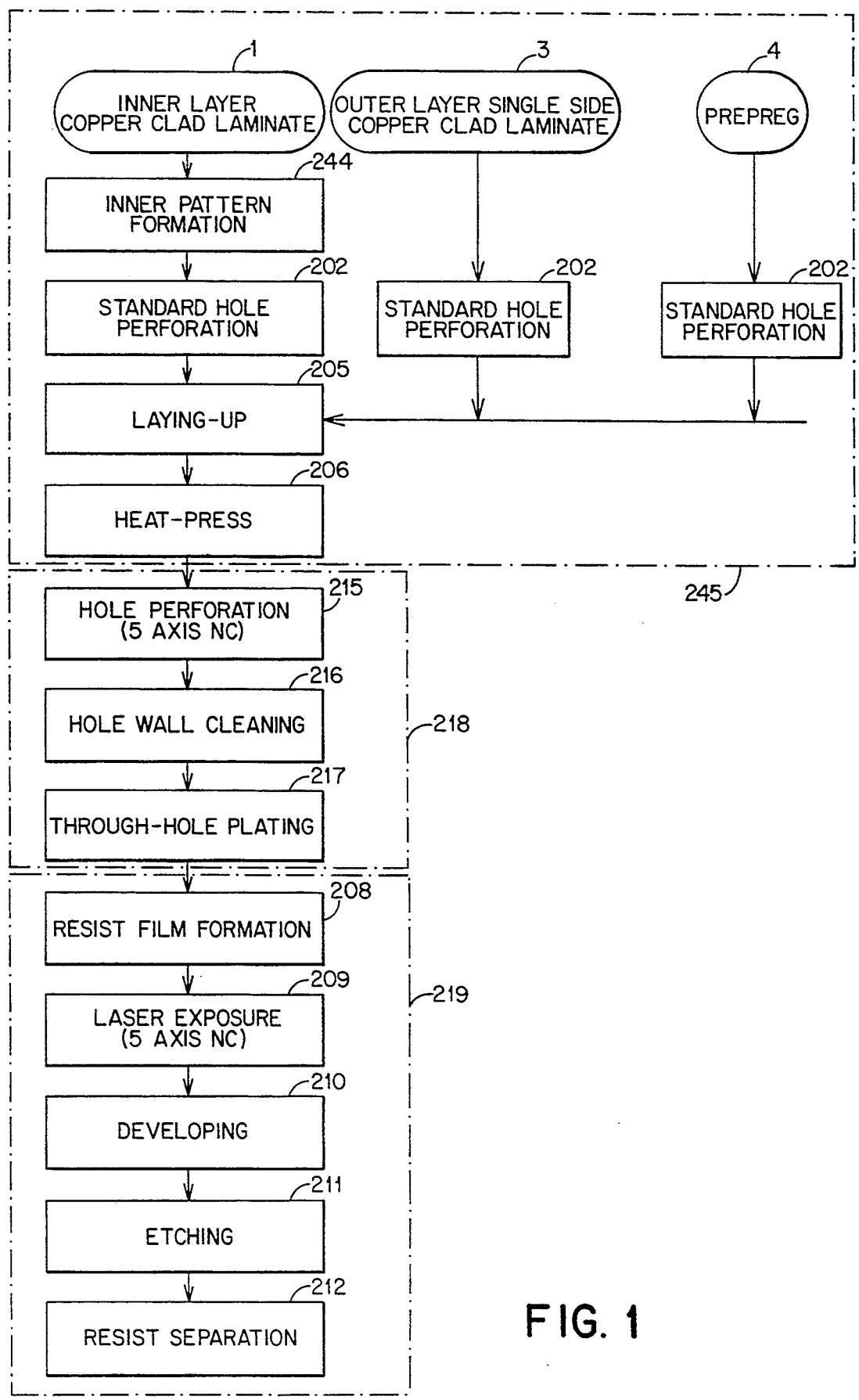
FIG. 1 is a manufacturing process chart of the first embodiment of the present invention.

FIG. 1 is a manufacturing process chart of the first embodiment of the present invention, In FIG. 1, 1 is an inner layer copper clad laminate, 3 is an outer layer single side copper clad laminate and 4 is a prepreg. Step 202 is a process for perforating standard holes; step 244 is a process for forming an inner layer pattern on the inner layer copper clad laminate 1; step 205 is a process for laying up the inner layer copper clad laminate, the outer layer single side copper clad laminate 3 and the prepreg 4; and step 206 is a process for pressing the laid-up materials together with applying heat. A laying-up process (step 245) includes the steps 244, 202, 205 and 206. Step 218 is a process for forming through-holes between the layers which includes a steps 215, 216, and 217. Step 219 is a process for forming an outer layer which includes steps 208, 209, 210, 211 and 212. These steps are explained below.

Figure 2A:
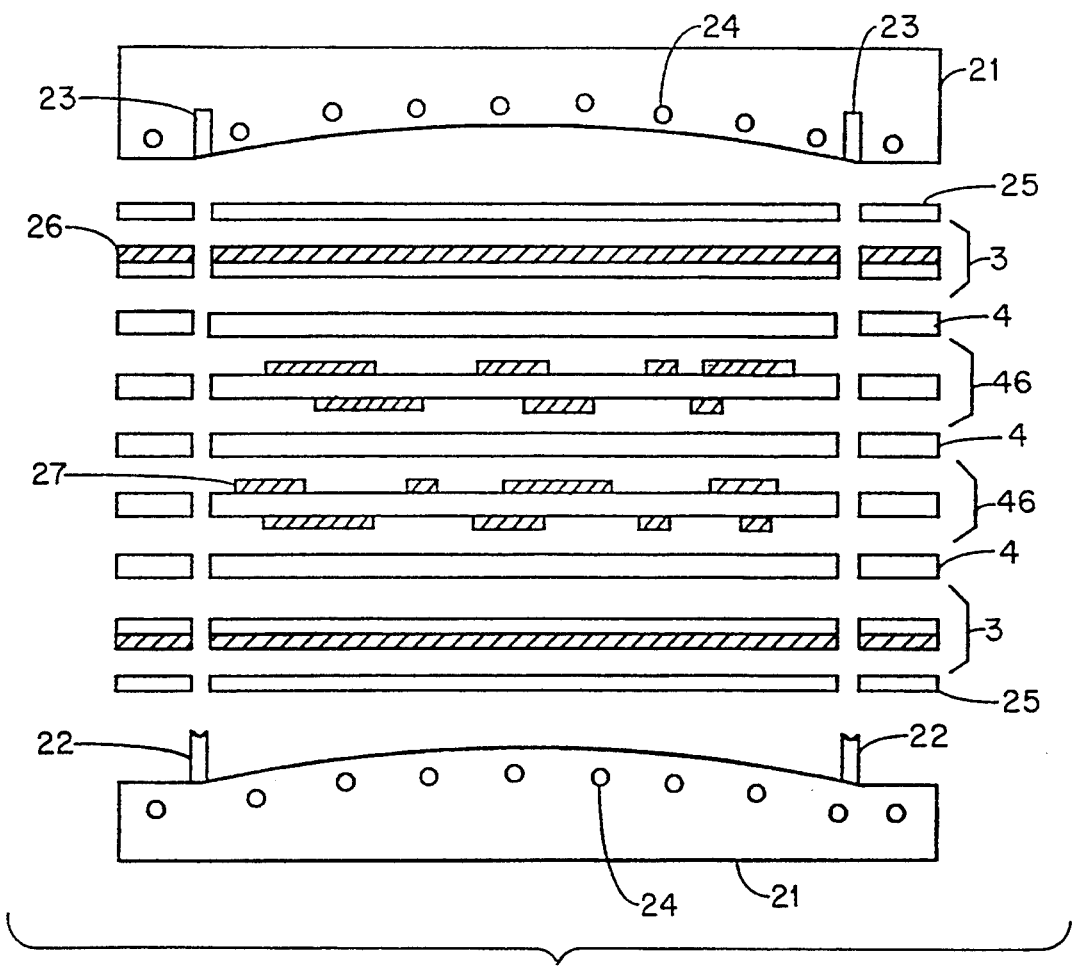
FIG. 2(a) is a sectional view of a heat press apparatus of the first embodiment of the present invention.

FIG. 2(a) is a sectional view of a heat press apparatus of the first embodiment of the present invention. 3 is an outer layer single side copper clad laminate and 4 is a prepreg. 21 is a formation mould. 22 and 23 are standard pins and standard pin acceptance holes formed on the above formation mould 21 respectively. 24 are heaters for heating the laid-up laminates. 25 are separation films, 27 are inner patterns. 46 is a flat inner layer substrate obtained by executing the inner layer pattern formation step 244 and standard hole perforation step 202 to the inner layer copper clad laminate 1.

Figure 2B:
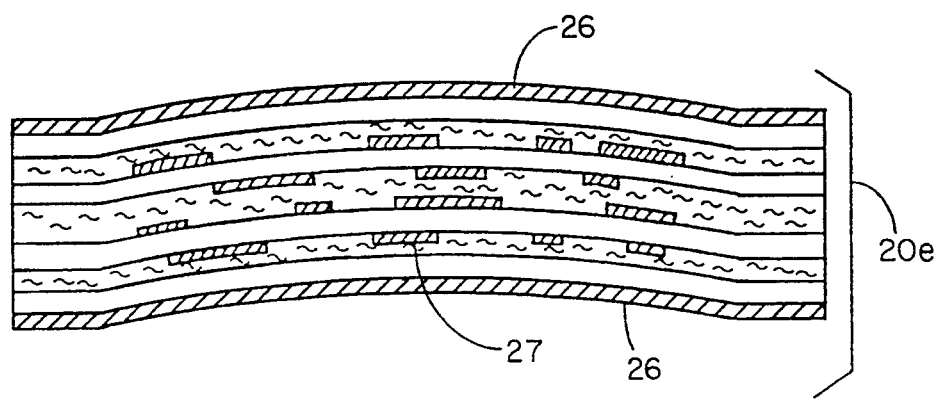
FIG. 2(b) is a sectional view of a curved surface multi-layer wiring board without through-holes and outer patterns.

FIG. 2(b) is a sectional view of a curved surface multi-layer wiring board manufactured. In FIG. 2 (b), 20e is a curved surface multi-layer wiring board manufactured in the heat-press step 206. 26 is a copper film. 27 is an inner layer pattern.

Referring to FIG. 1, FIG. 2(a) and FIG. 2(b), at first, inner patterns 27 are formed on the inner layer copper clad laminate 1 such as a thermosetting resin at a flat state by the inner pattern forming process 244, and a flat inner layer substrate 46 is obtained. Then, standard holes are perforated into the inner layer copper clad laminate 1, the outer layer single side copper clad laminate 3, and the prepreg 4 in the standard hole perforation step 202. The flat inner layer substrates 46 obtained in step 202 are laid up together with the outer layer single side copper clad laminate 3, the prepreg 4, and the separation film 25 by aligning the standard holes on the pair of the formation mould 21 in the laying-up step 205. The laid-up materials are pressed by applying heat generated from the inner-mounted heater 24 in the heat-press step 206. As a result of the heat-press step 206, the curved surface multi-layer wiring board 20(e) is obtained as shown in FIG. 2(b).

Figure 3A:
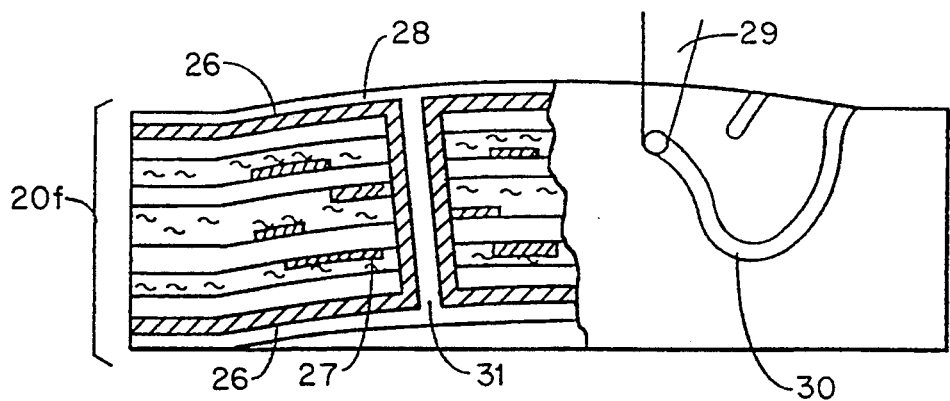
FIGS. 3(a) and 3(b) are sectional views of a curved surface multi-layer wiring board having an outer pattern.
Figure 3B:
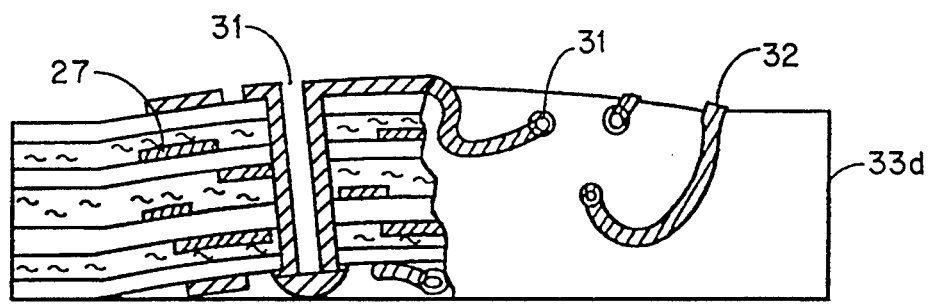

FIGS. 3(a) and 3(b) are sectional views of a curved surface multi-layer wiring board and an outer pattern on it. Referring to FIG. 1 and FIGS. 3(a) and 3(b), after laying-up process 245, desired holes are perforated in the curved surface multi-layer wiring board by the five axis NC machine in the perforation step 215, and the walls of the holes are cleaned (step 216). The walls of the holes are plated for connecting the inner layer pattern 27 (step 217).

The outer layer formation step 219 is explained with reference to FIG. 1 and FIGS. 3(a) and 3(b). After the through-hole formation step 218, a resist layer 28 is formed on a copper film 26 using the electro-deposition resist or splay in the resist film formation step 208. Then, resist patterns 30 are formed by exposing and patterning the laser light 29 directly on the surface of the curved surface multi-layer wiring board using the five axis NC machine in the laser exposure step 209 (see FIG. 3(a)).

Figure 3C:
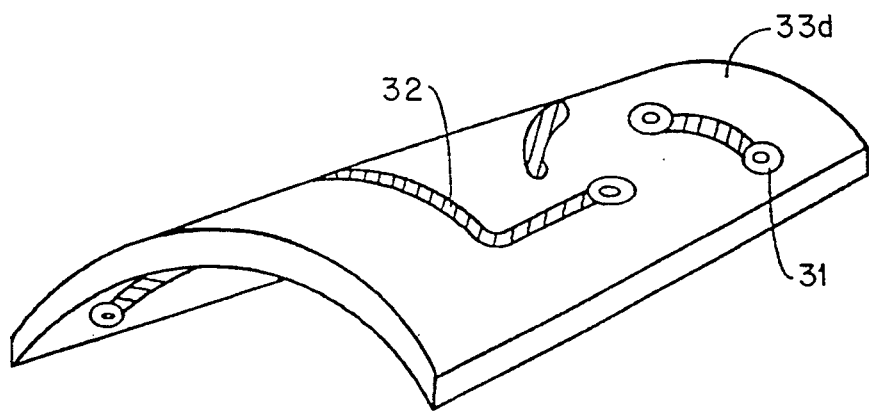
FIG. 3(c) is a perspective view of the curved surface multi-layer wiring board manufactured.

Finally, the curved surface multi-layer wiring board 33d is obtained by forming outer patterns 32 through the developing step 210 and the etching step 211 and the resist separation step 212 (see FIG. 3(b), 3(c)).

FIG. 3(c) shows a perspective view of an outer pattern of the curved surface multi-layer wiring board manufactured by the outer layer formation step 219.

Second Embodiment

Figure 4:
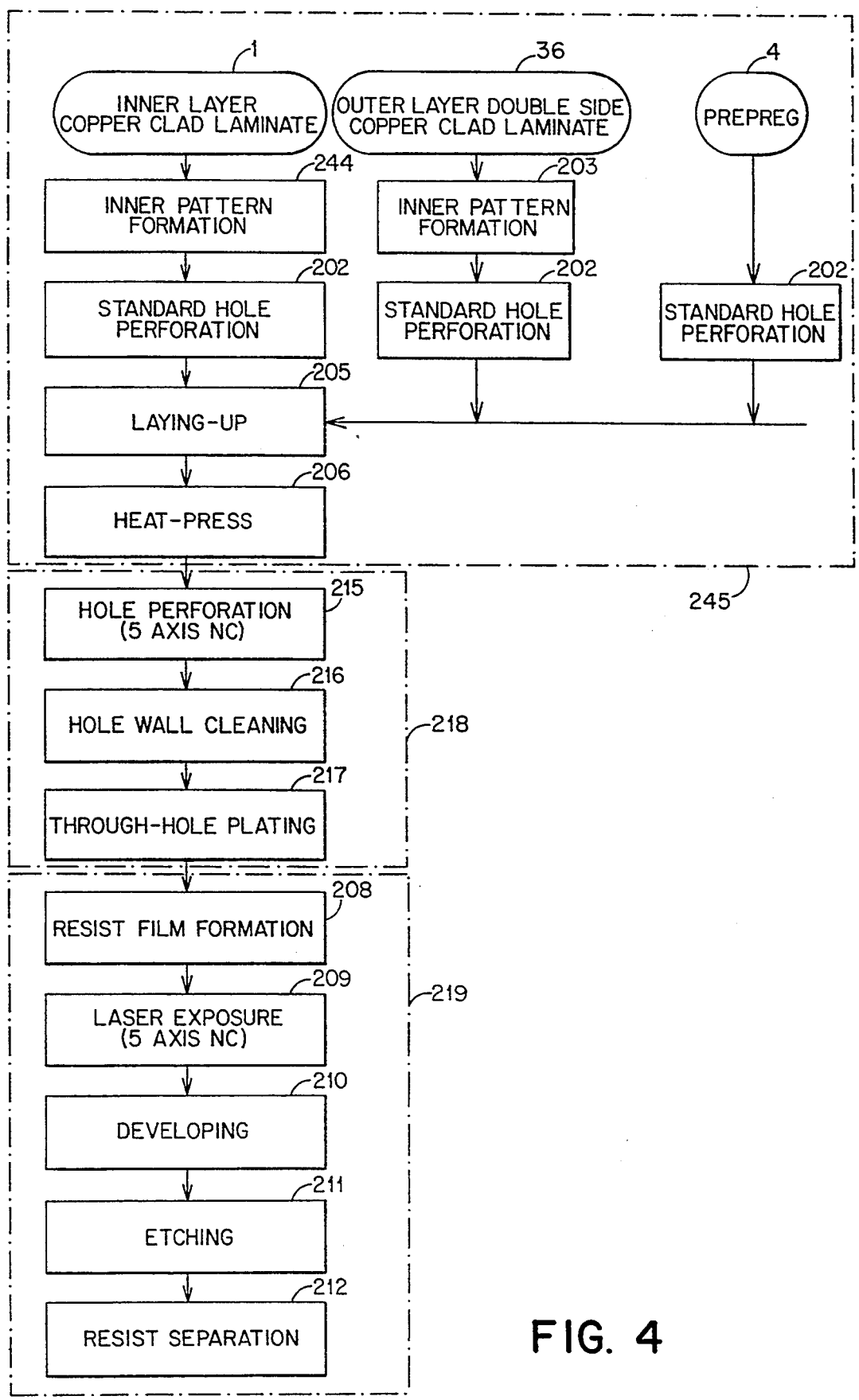
FIG. 4 is a manufacturing process chart of the second embodiment of the present invention.

FIG. 4 is a manufacturing process chart of the second embodiment of the present invention. In the above first embodiment, the inner layer patterns are formed on the inner layer copper clad laminate 1 as shown in FIG. 1, but the inner patterns may be formed on the outer layer double side copper clad laminate 36 as shown in FIG. 4. In the second embodiment, two layers are added by using an outer layer double side copper clad laminate 36.

Third Embodiment

Figure 5:
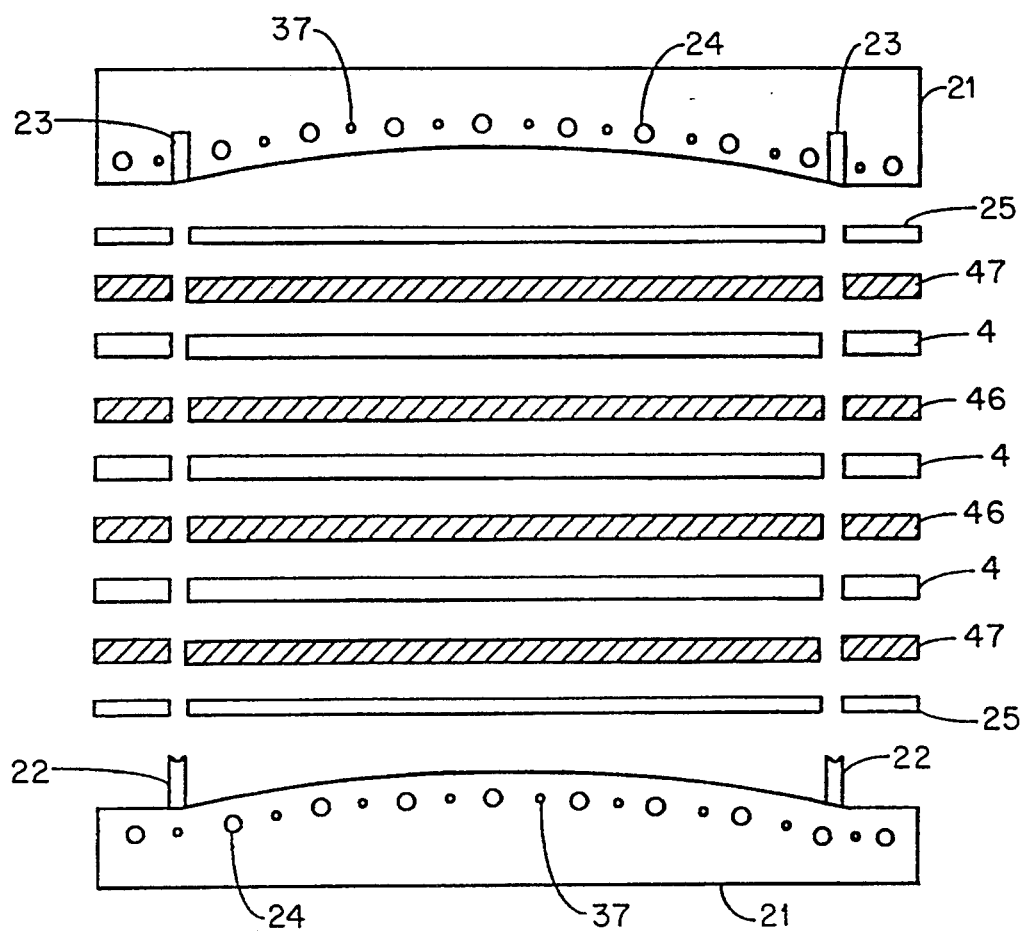
FIG. 5 is a sectional view of a heat press apparatus of a third embodiment of the present invention.

FIG. 5 is a sectional view of a heat press apparatus of the third embodiment of the present invention used in the step 206 in FIG. 1 and FIG. 4 for forming the curved surface multi-layer wiring board. The board includes an outer layer substrate 47 which may be either single sided, as in FIG. 1, or double sided as in FIG. 2, with a pattern formed on the inside layer; and an inner layer substrate 46.

In FIG. 5, 24 are heaters for heating the laid-up laminates; and 37 are temperature sensors for sensing and controlling the temperature of the formation mould 21. In the first and the second embodiments of the present invention, the materials are heated by the heaters installed inside of the formation mould 21. The surface temperature and the temperature distribution of the formation mould 21 sometimes shift from the desired setting value by the influences of materials of the mould, the surface shape of the laminates and other temperature environmental conditions. In that case, the desired shape of the curved surface multi-layer wiring board can not be obtained.

In the third embodiment of the present invention, a plurality of the temperature sensors 37 which are installed in the formation mould 21 control the surface temperature and the temperature distribution of the formation mould 21. As a result, the heaters 24 are controlled to maintain the desired temperature and temperature distribution in order to obtain a desired shape of the curved surface multi-layer wiring board.

Fourth Embodiment

Figure 6:
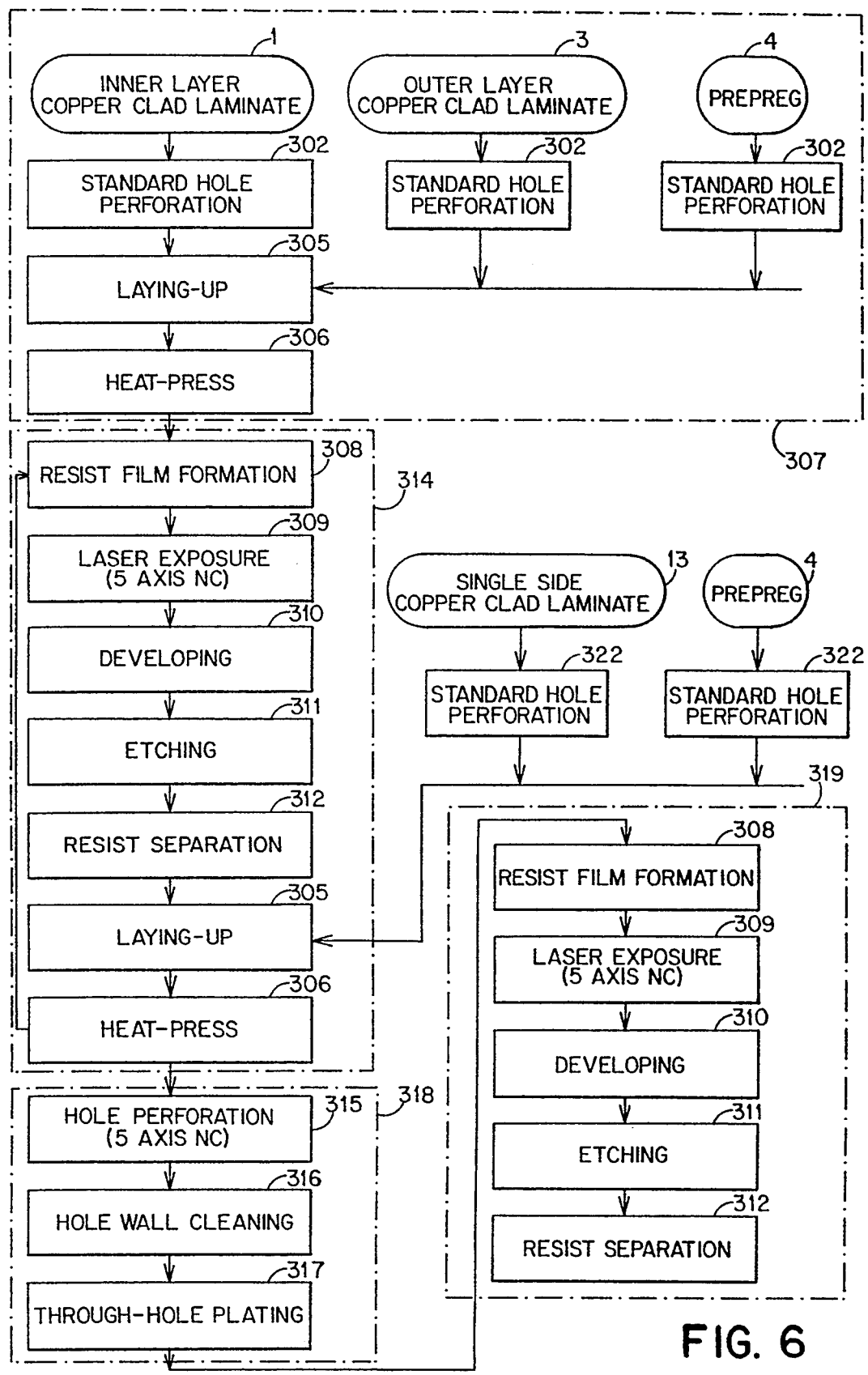
FIG. 6 is a manufacturing process chart of a fourth embodiment of the present invention.

FIG. 6 is a manufacturing process chart of the fourth embodiment of the present invention. In FIG. 6, 1 is an inner layer copper clad laminate, 3 is an outer layer copper clad laminate and 4 is a prepreg. Steps 302 to 306, steps 308 to 312, and steps 315 to 317 are similar to the processes shown in the first embodiment of FIG. 1 and FIG. 4.

In FIG. 6, step 307 is a base formation process for laying up inner layer copper clad laminates 1 in which standard holes are perforated (step 302), outer layer copper clad laminates 3 in which standard holes are perforated (step 302) and prepregs 4 in which standard holes are perforated (step 302), and for pressing them between the pair of the mould in order to form the wiring board. A base formation process (step 307) also includes a laying-up process (step 305) and a heat-press process (step 306). Step 314 includes resist film formation step 308, laser exposure step 309, developing step 310, etching step 311, resist separation step 312, laying-up step 305 and heat-press step 306. Step 314 repeats the steps of laying up the single side copper clad laminate 13 and the prepreg 4 on the curved surface clad substrate, after forming the inner layer pattern 27 on the curved surface clad substrate by laser light 29 using the five axis NC machine.

A fourth method for manufacturing a curved surface multi-layer wiring board is described hereinafter using FIG. 6, FIG. 7, FIG. 8 and FIG. 9.

Figure 7A:
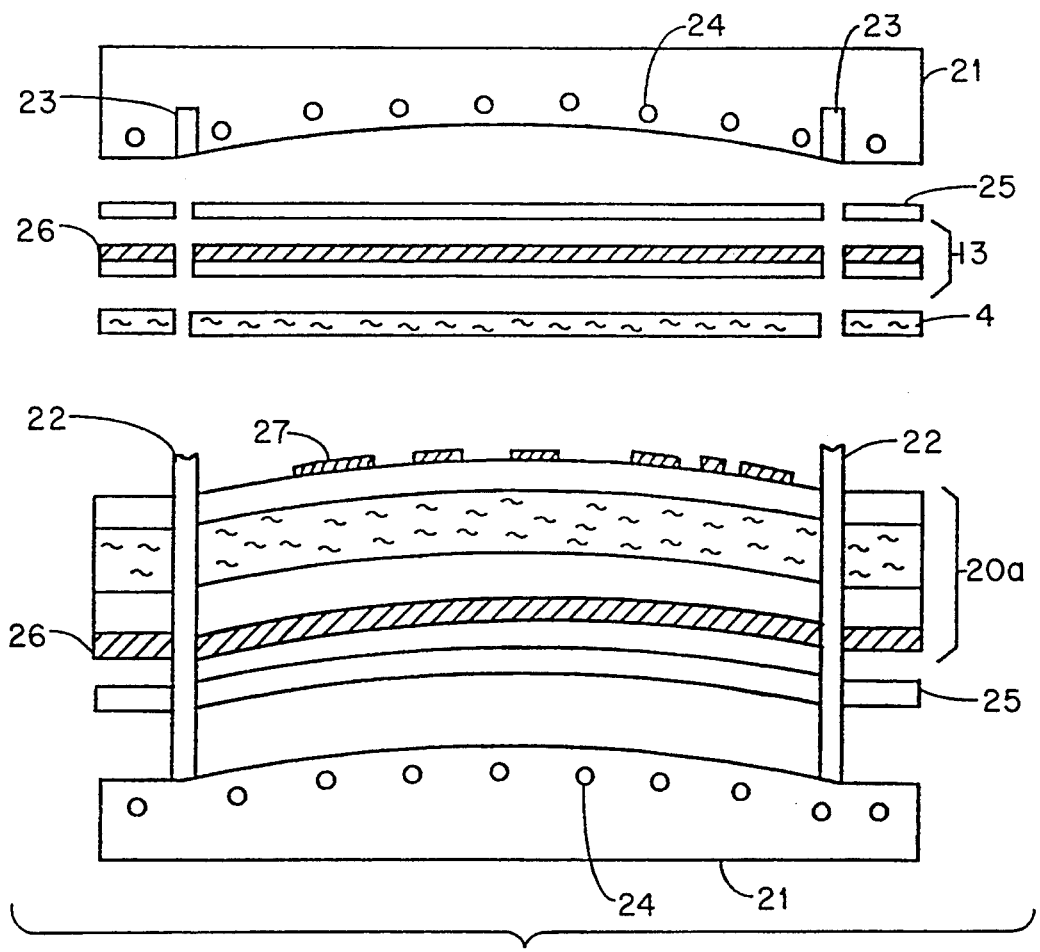
FIG. 7(a) is a sectional view of a heat press apparatus of a fourth embodiment of the present invention.
Figure 7B:
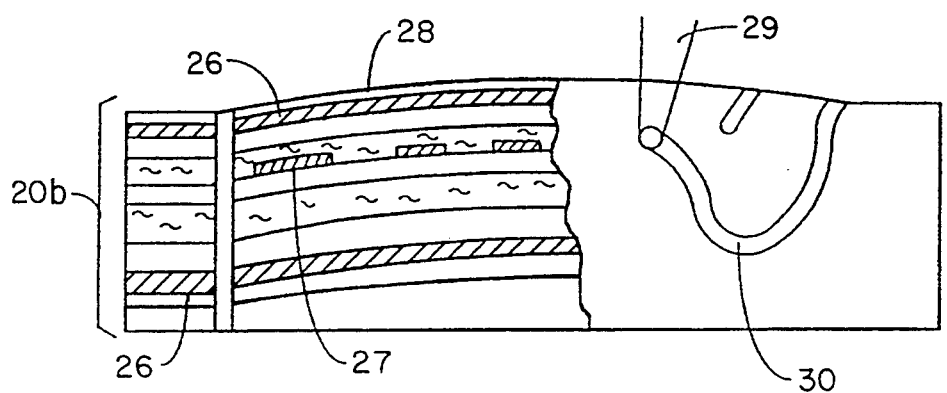
FIG. 7(b) is a sectional view of a curved surface multi-layer wiring board with through-holes and a resist pattern according to the fourth embodiment of the present invention.

FIG. 6 is a manufacturing process chart of a fourth embodiment of the present invention. FIG. 7(a) is a sectional view of a heat press apparatus of a fourth embodiment of the present invention. FIG. 7(b) is a sectional view of a curved surface multi-layer wiring board and resist patterns on it of the fourth embodiment of the present invention.

In FIG. 6, the standard holes are perforated in the inner layer copper clad laminate 1 such as the thermosetting resin series, the outer layer copper clad laminate 3, and the prepreg 4. The above inner layer copper clad laminate 1, the outer layer copper clad laminate 3 and the prepreg 4 are laid up with the separation film 25 between the pair of the moulds by aligning the standard pins 22 and the standard pin acceptance holes 23. Then, the laid-up materials are pressed by the moulds by applying heat generated by the inner heater 24 as well as the press heater not shown in the figure in the step 307.

Step 314 is explained hereinafter using FIG. 6 and FIG. 7(b). A resist film 28 is formed on the copper film 26 using an electro-deposition resist or splay in the resist film formation step 308. Then, resist patterns 30 are formed by exposing and patterning the laser light directly on the surface of the curved surface multi-layer wiring board using a five axis NC machine in the laser exposure step 309. Then, the curved surface multi-layer wiring board 20a is obtained by forming the inner patterns 27 through developing step 310, etching step 311, and resist separation step 312 (see FIG. 7).

Standard holes are perforated into the single side copper clad laminate 13 and the prepreg 4 (step 322). The single side copper clad laminate 13 and the prepreg 4 obtained by executing perforation steps 322 are laid together with the separation film 25 by aligning the standard holes on the pair of the formation mould 21 in the lay up step 305. Then the curved surface multi-layer wiring board 20a is pressed by applying the heat in the heat-press step 306. These steps for forming the inner layer pattern 27 and for laying up the single side copper clad laminate 13 are repeated more than one time in step 314. By repeating the process of step 314, the number of layers can be increased.

After step 314, step 318 is executed. The step 318 includes a steps 315, 316, and 317. In the hole perforation step 315, holes are perforated for the desired direction in the curved surface multi-layer wiring board by the five axis NC machine, then the walls of the holes are cleaned in the hole cleaning step 316. The walls are plated to connect the inner layer pattern 27 through the holes in the plating step 317. After step 318 is finished, a curved surface multi-layer wiring board 20c is obtained as shown in FIG. 8.

Figure 8:
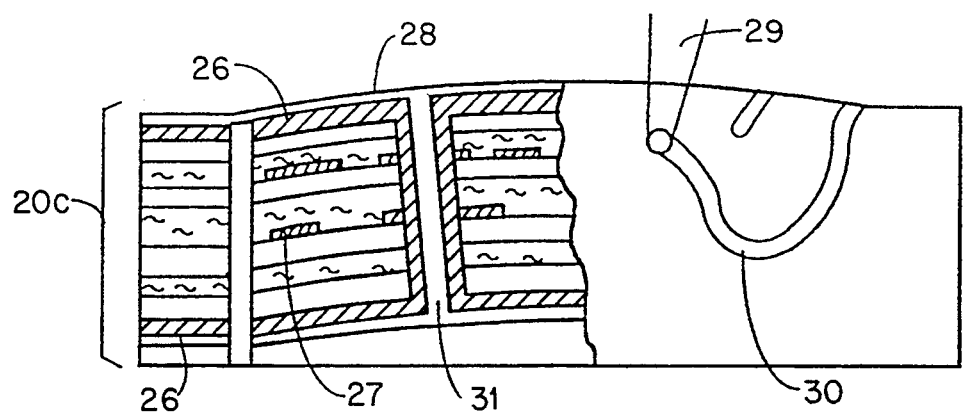
FIG. 8 is a sectional view of a curved surface multi-layer wiring board without through-holes and resist patterns according to the fourth embodiment of the present invention.

FIG. 8 is a sectional view of a curved surface multi-layer wiring board and sensitized patterns on it of the fourth embodiment of the present invention.

Figure 9:
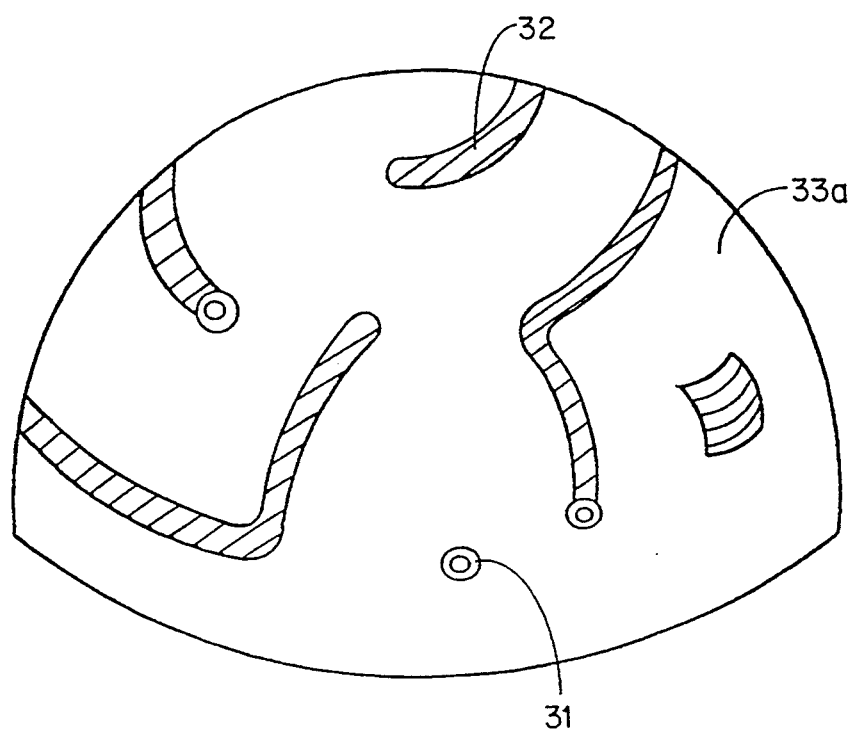
FIG. 9 is a perspective view of the curved surface multi-layer wiring board of the fourth embodiment of the present invention.

The outer layer formation step 319 is explained with reference to FIG. 6, FIG. 8, and FIG. 9. After the through-hole formation step 318, a resist layer 28 is formed on the copper film 26 using the electro-deposition resist or splay in the resist film formation step 308. Then, resist patterns 30 are formed on the surface of the curved surface multi-layer wiring board by exposing and patterning directly using the laser light 29 and the five axis NC machine in the laser exposure step 309 (see FIG. 8). Finally, the curved surface multi-layer wiring board 33a is obtained by forming the outer patterns 32 through the developing step 310, the etching step 311 and the resist separation step 312 (see FIG. 9). FIG. 9 is a perspective view of a curved surface multi-layer wiring board of the fourth embodiment of the present invention.

Fifth Embodiment

As described in FIG. 7, the curved surface multi-layer wiring board 20a is pressed between the pair of the formation moulds 21 in the heat-press step 306 and the step 314 in FIG. 6. This step 306 may be substituted to a formation step 434 in FIG. 10 using an autoclave formation mould 35 and a vacuum packing 60 as shown in FIG. 11.

Figure 10:
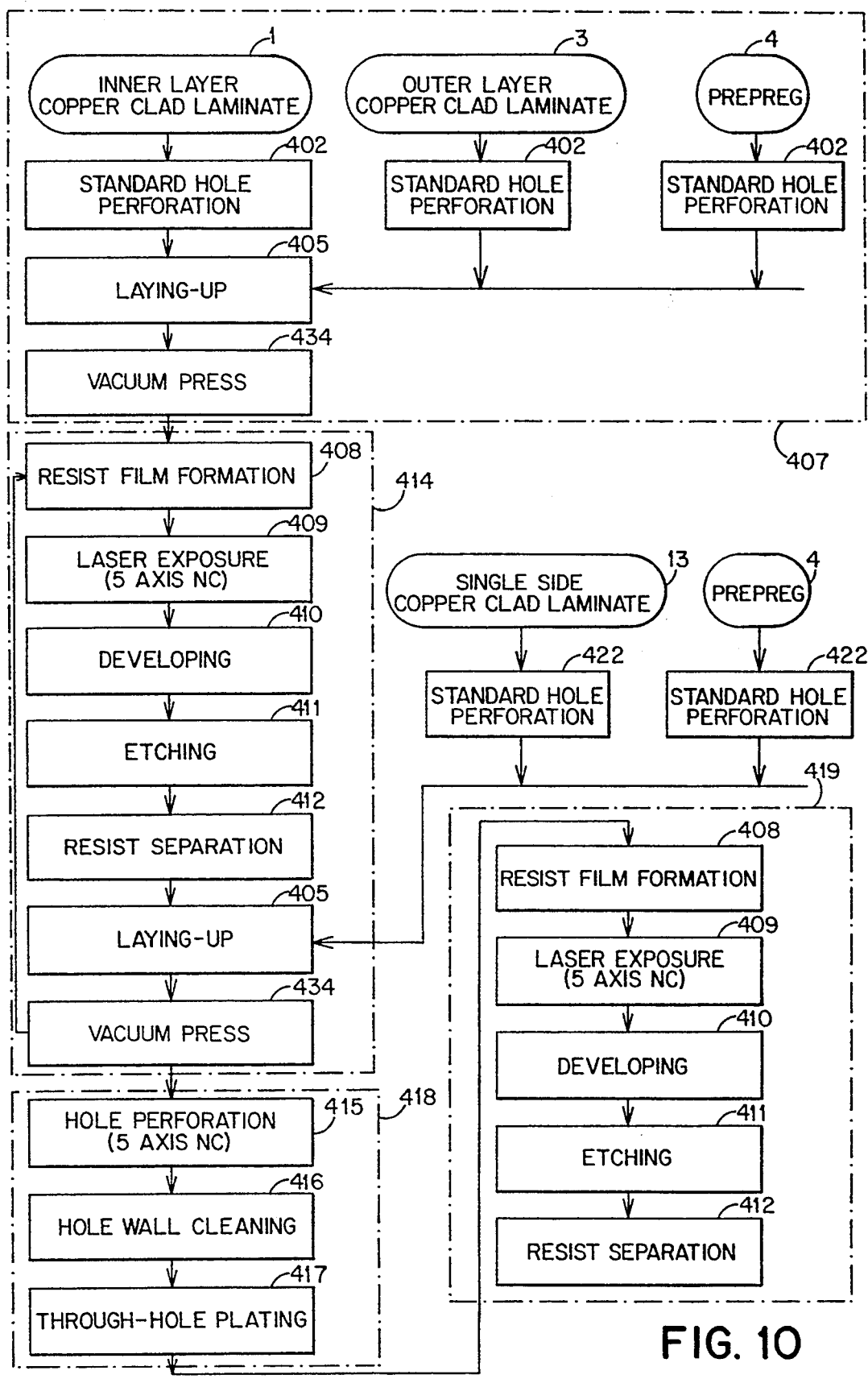
FIG. 10 is a manufacturing process chart of a fifth embodiment of the present invention.
Figure 11:
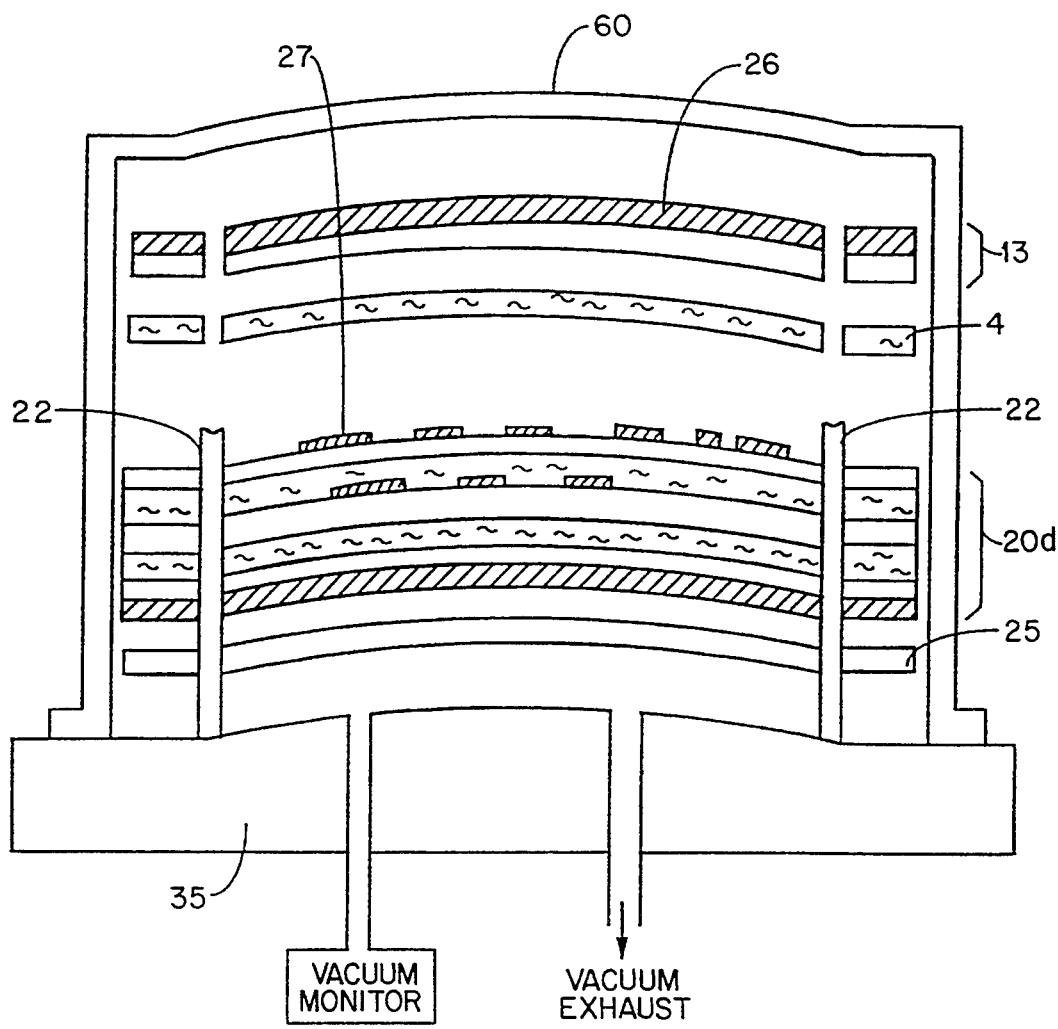
FIG. 11 is a sectional view of the vacuum autoclave formation mould of the fifth embodiment of the present invention.

FIG. 10 is a manufacturing process chart of the fifth embodiment of the present invention. FIG. 11 is a sectional view of the vacuum autoclave formation mould of the fifth embodiment of the present invention.

A step for forming the curved surface multi-layer wiring board in the vacuum autoclave formation mould is explained hereinafter using FIG. 10 and FIG. 11.

In the step 434 of the base formation step 407 of FIG. 10, the inner layer copper clad laminate 1, the outer layer copper clad laminate 3, and the prepreg 4 are laid up on the autoclave formation mould 35. After the autoclave formation mould 35 is covered by the vacuum packing 60, the inner air is exhausted by the vacuum pump in the step 434. Also in the step 434 of the step 414 of FIG. 10, the curved surface clad substrate 20d, a single side copper clad laminate 13, and the prepreg 4 are laid up on the autoclave formation mould 35. As a result, the laid-up materials are pressed by the vacuum pressure and the curved surface multi-layer wiring board is obtained as shown in FIG. 11.

This method is advantageous in that only one formation mould is needed regardless of the number of the copper clad laminate layers. Accordingly, manufacturing costs are saved to a large extent.

Sixth Embodiment

Figure 12:
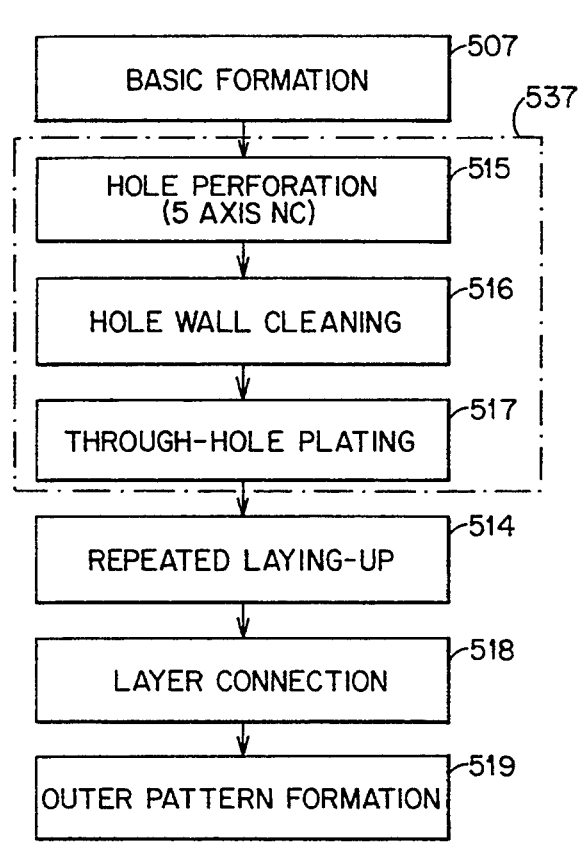
FIG. 12 is a manufacturing process chart of a sixth embodiment of the present invention.
Figure 13:
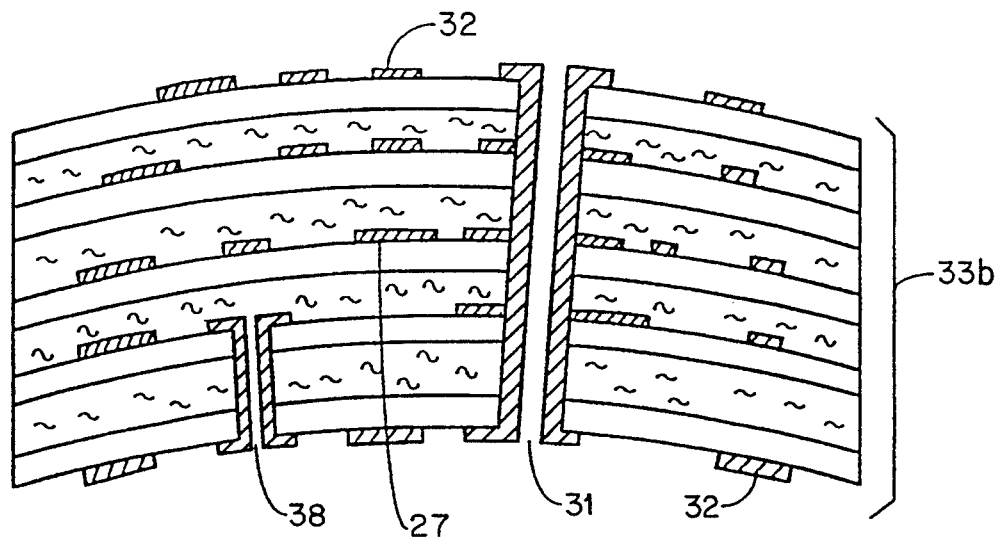
FIG. 13 is a sectional view of blind-via-holes in the curved surface multi-layer wiring board of the sixth embodiment of the present invention.

FIG. 12 is a manufacturing process chart of the sixth embodiment of the present invention and FIG. 13 is a sectional view of blind-via-holes 38 in the curved surface multi-layer wiring board of the sixth embodiment of the present invention. After the basic formation process 507 in FIG. 12 is finished, blind-via-holes 38 are formed between the layers as shown in FIG. 13. The blind-via-hole formation step 537 is shown in detail in steps 515 to 517 of FIG. 12. A repeated laying-up step 514 in FIG. 12 is the same process as that of step 314 in FIG. 6 and the step 414 in FIG. 10.

In the hole perforation step 515, holes are perforated for the desired direction in the curved surface multi-layer wiring board by the five axis NC machine, then the walls of the holes are cleaned in the cleaning step 516. The walls of the holes are plated for connecting the inner layer pattern 27 through the blind holes in the through hole plating step 517. After the step 537, blind-via-holes 38 are formed as shown in FIG. 13.

This embodiment is advantageous in that blind-via-holes may be formed in addition to the through-holes 31.

Seventh Embodiment

Figure 15:
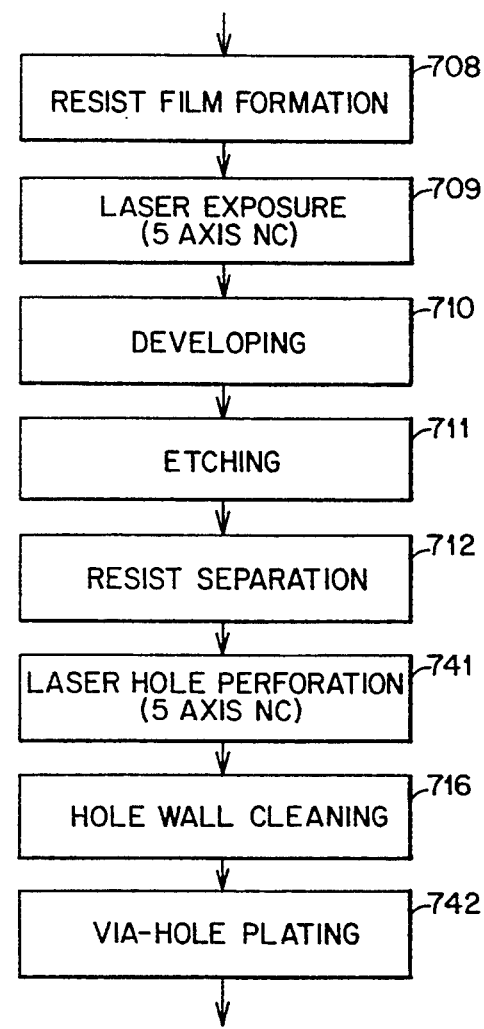
FIG. 15 is a via-hole formation process in a manufacturing process chart of the seventh embodiment of the present invention.
Figure 14:
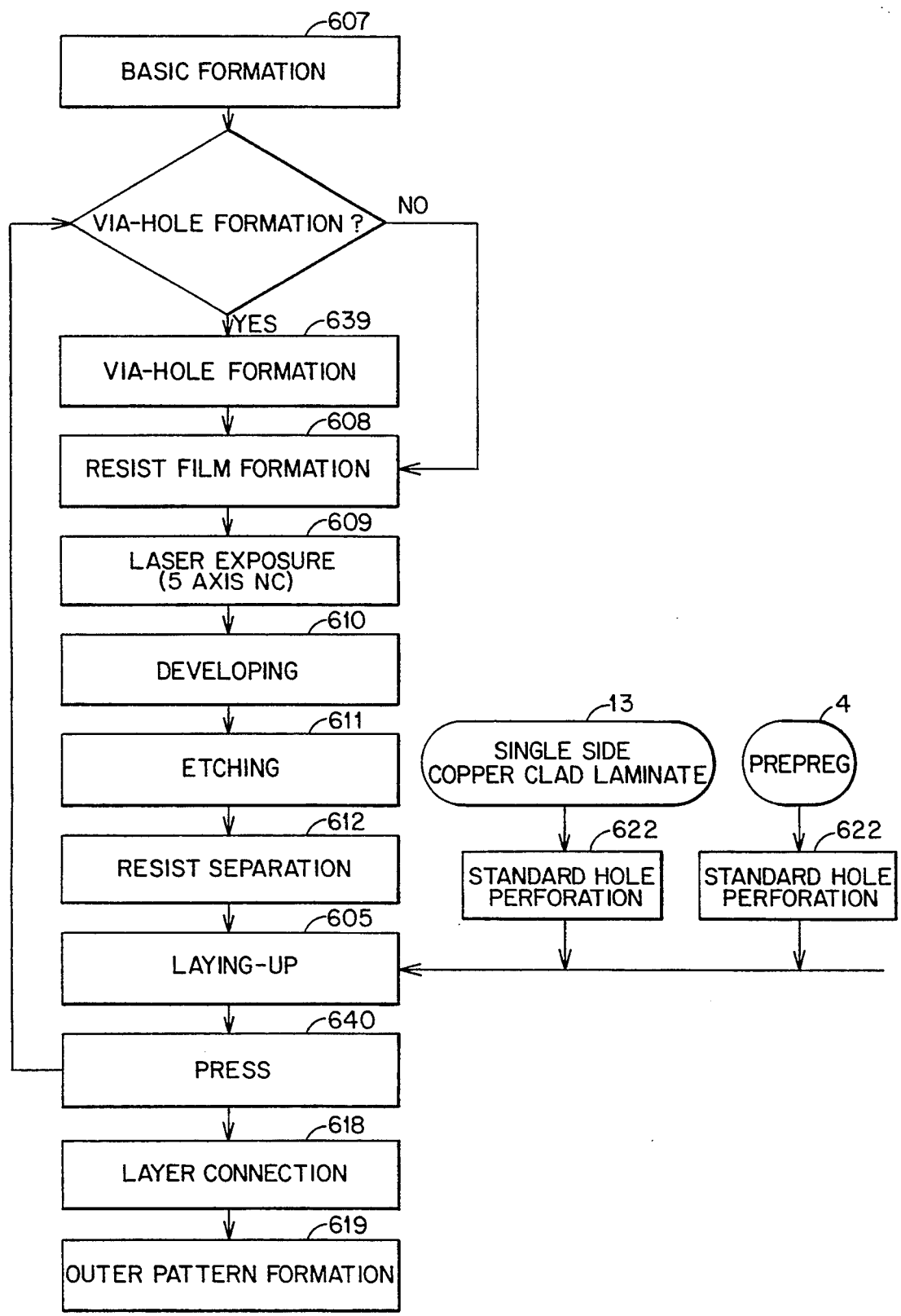
FIG. 14 is a manufacturing process chart of a seventh embodiment of the present invention.

FIG. 14 is a manufacturing process chart of the seventh embodiment of the present invention; FIG. 15 shows a via-hole forming process chart 639 of FIG. 14 of the seventh embodiment of the present invention; and FIG. 16 is a sectional view of an inner via-hole 43 in the curved surface multi-layer wiring board of the seventh embodiment of the present invention.

Figure 16:
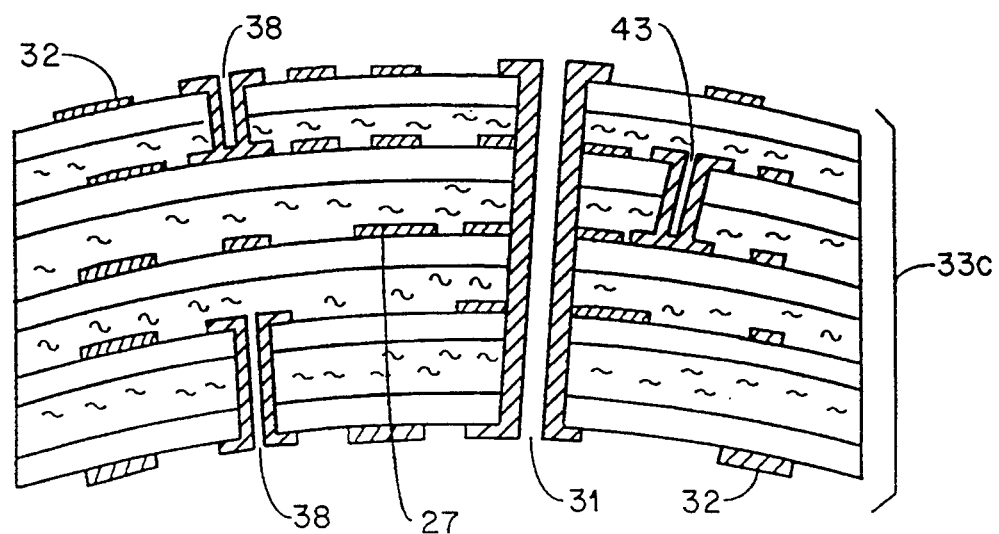
FIG. 16 is a sectional view of an inner via-hole in the curved surface multi-layer wiring board of the seventh embodiment of The present invention.

After the basic formation process 607 in FIG. 14 is finished, blind-via-holes 38 or inner via-holes 43 are formed between the layers as occasion demands, and then a single side copper clad laminate 13 is laid up for more than one time after an inner pattern 27 in FIG. 16 is formed by the laser exposure using the five axis NC machine.

The seventh embodiment of the present invention includes a via-hole formation step 639 before the resist formation step 608 which forms the inner layer patterns, and then the blind-via-hole 38 or inner via-holes 43 are formed between the layers as occasion demands.

As shown in FIG. 15, the via-hole formation step 639 includes resist film formation step 708, laser exposure step 709 using the five axis NC machine, developing step 710, etching step 711, and resist separation step 712, which remove parts of the copper films where the via-holes are formed. The via-hole formation step 639 also includes a laser hole perforation step 741 using the five axis NC machine, a hole when cleaning step 716 and a via-hole plating step 742.

This embodiment has the advantage that inner via-holes 43 may be formed in addition to the through-holes 31 and blind-via-hole 38 as shown in FIG. 16.

In the basic formation step of the embodiments 4–7, single side copper clad laminates are used for forming the curved surface clad substrate. Double side copper clad laminates may be used alternatively in these embodiments of the invention to obtain the same effect.

The copper film 26 and the insulation layer under the copper film 26 are perforated by the laser exposure (step 709), developing (step 710), etching (step 711 resist separation (step 712) and laser hole perforation process (step 741 in FIG. 15 which is a detailed flow chart of the via-hole formation step 639 in FIG. 14, but a drill may be used in order to perforate the copper film 26 and the insulation layer under the copper film 26.

Eighth Embodiment

Figure 17A:
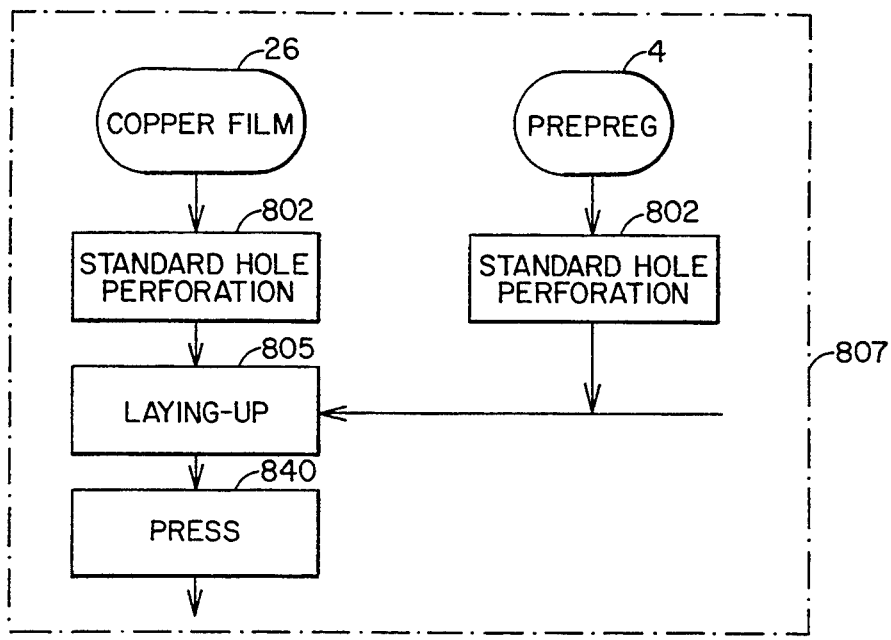
FIGS. 17(a)–17(b) are manufacturing process charts of the eighth embodiment of the present invention.
Figure 17B:
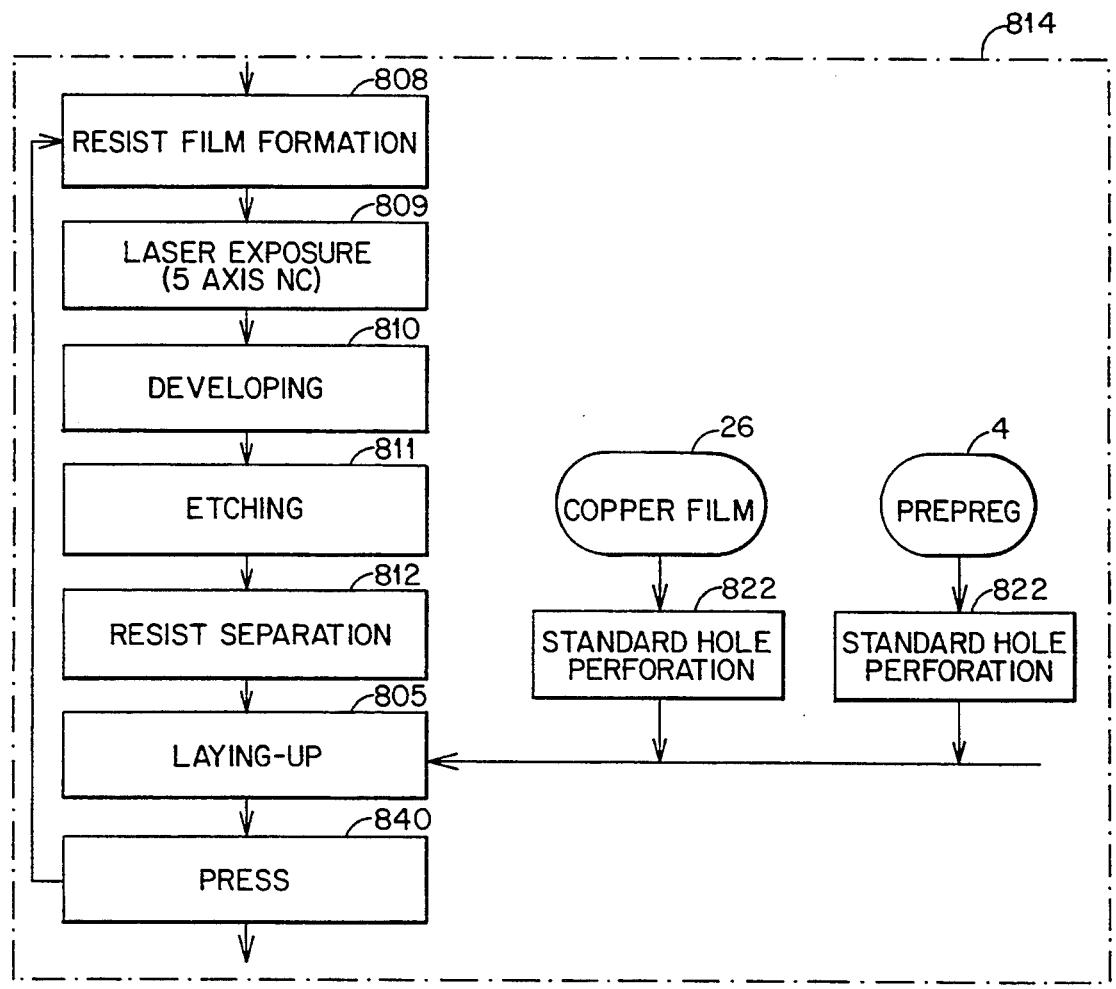

FIGS. 17(a) and 17(b) are manufacturing process charts of the eighth embodiment of the present invention. In the basic formation step 607 and laying-up step 605 of FIG. 14, the inner layer copper clad laminate 1, the outer layer copper clad laminate 3 and the single side copper clad laminate 13 may be substituted by a copper films 26 as shown in FIGS. 17(a) and 17(b) respectively.

In this embodiment, the residual stress which exists in the curved surface layer clad substrate can be reduced since the insulation materials consist of only the prepreg having a semi-hardenability. Therefore the curved multi-layer wiring board has less spring back characteristics. Thermosetting materials are used in the above embodiment, but thermoplastic materials may be used in order to obtain the same effect.

Ninth Embodiment

Figure 18A:
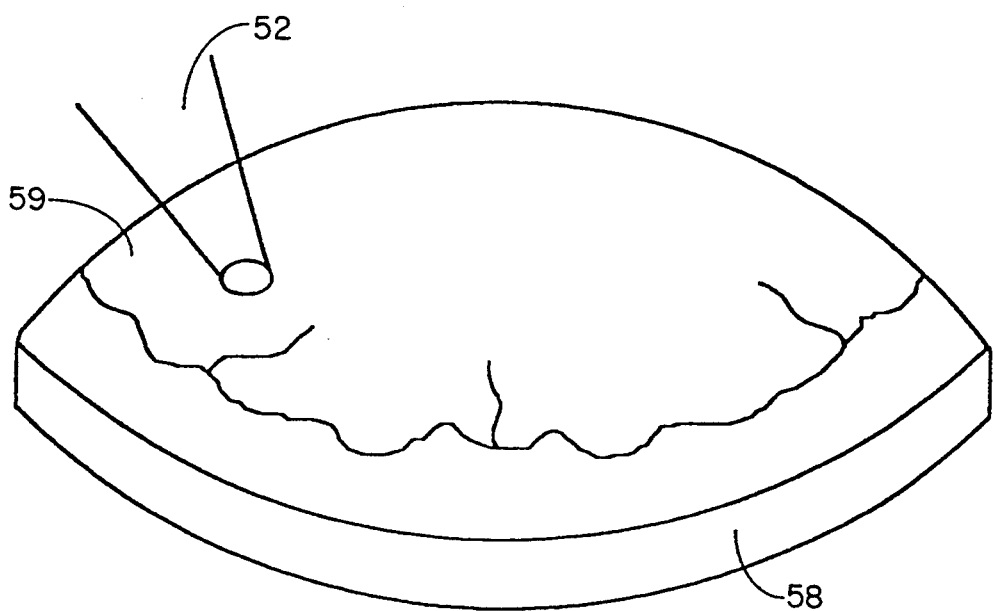
FIGS. 18(a)–18(b) are perspective views of sensitized patterns of the curved surface multi-layer wiring board for confirming the five axis NC data used for laser light exposure of the ninth embodiment of the present invention.
Figure 18B:
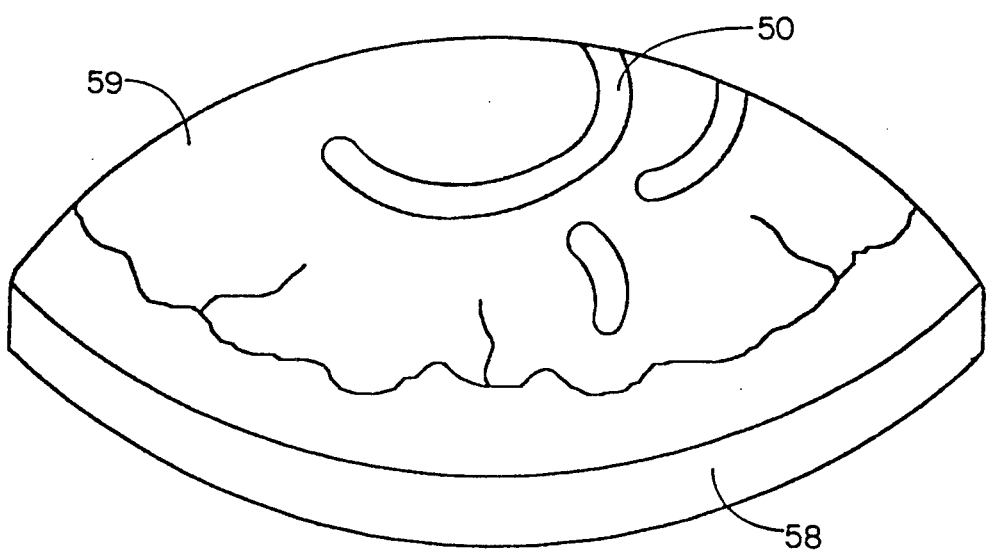
Figure 19:
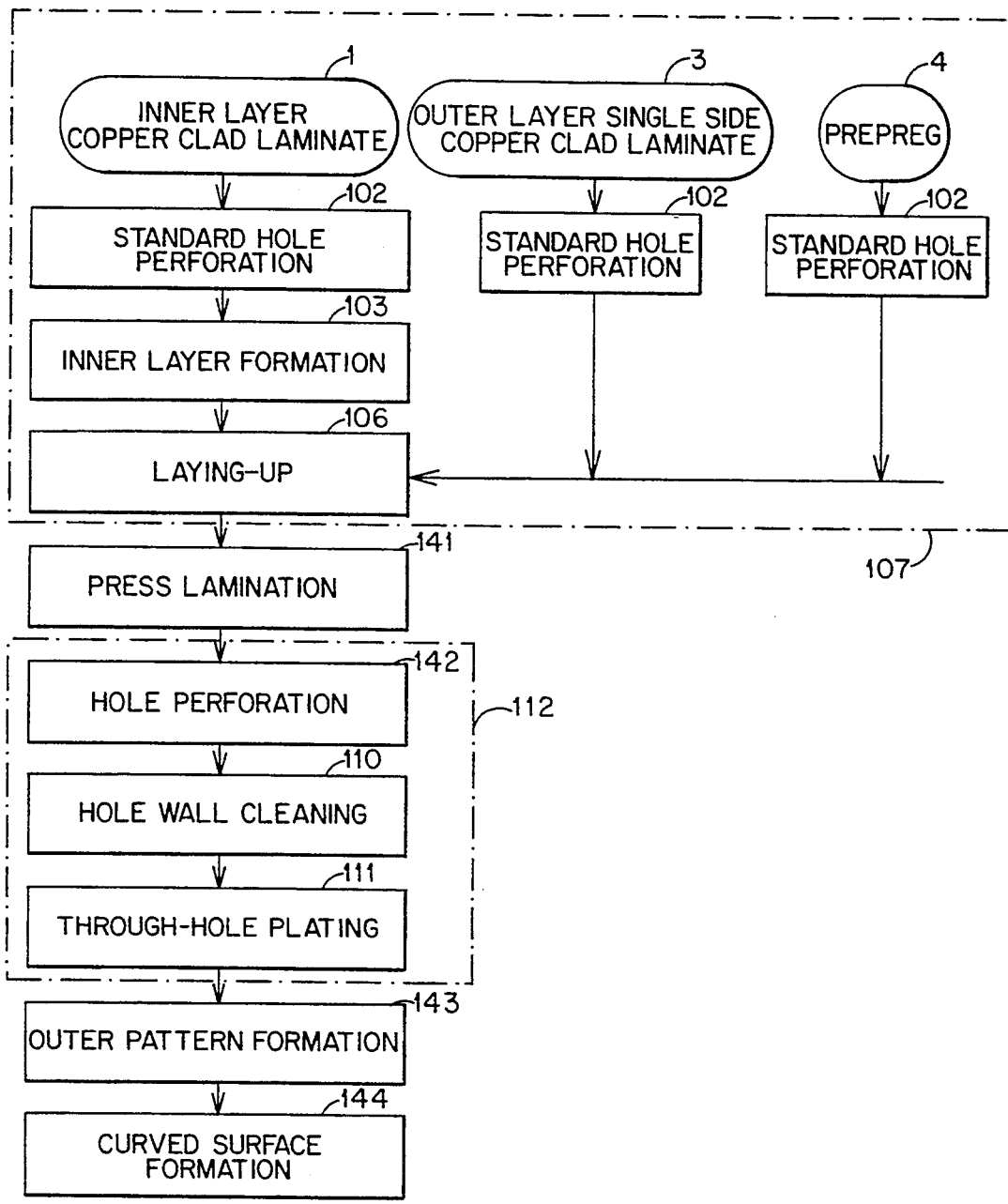
FIG. 19 is a manufacturing process chart of the prior art technology.
Figure 20A:
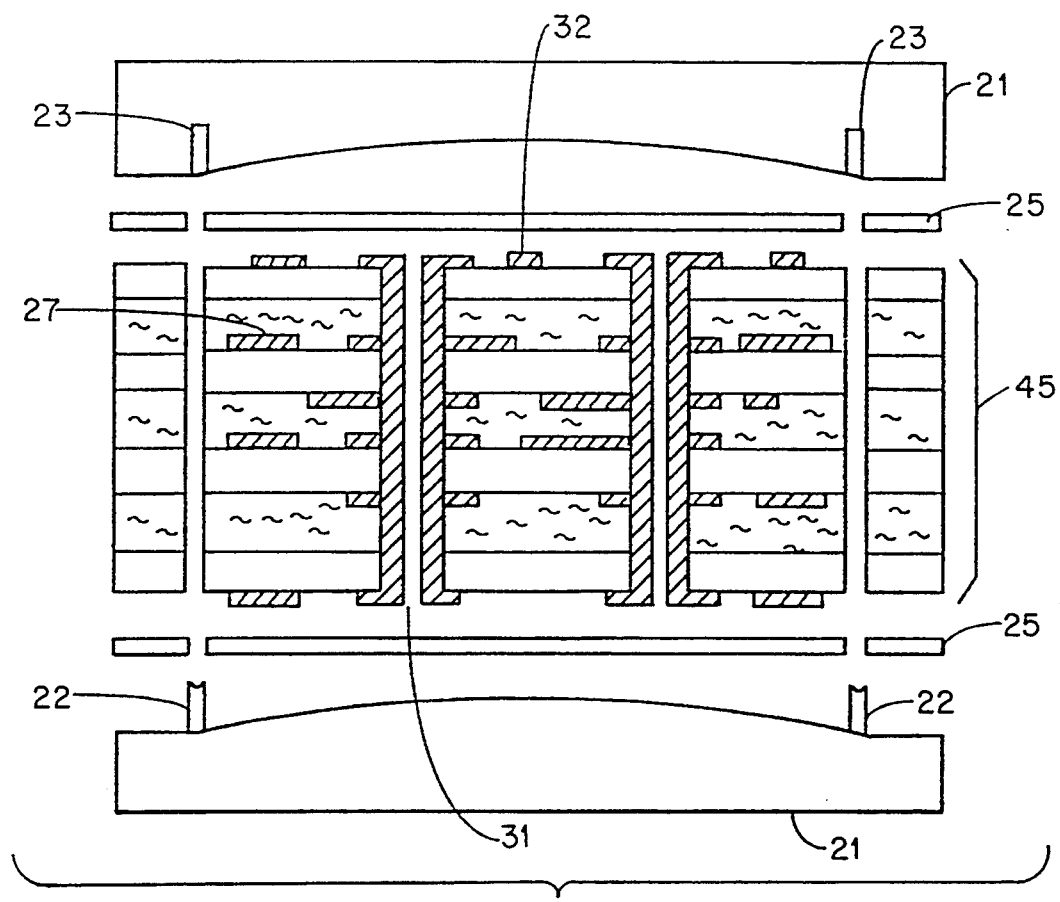
FIGS. 20(a)–20(b) are sectional views of a curved surface multi-layer wiring board of the prior art technology.
Figure 20B:
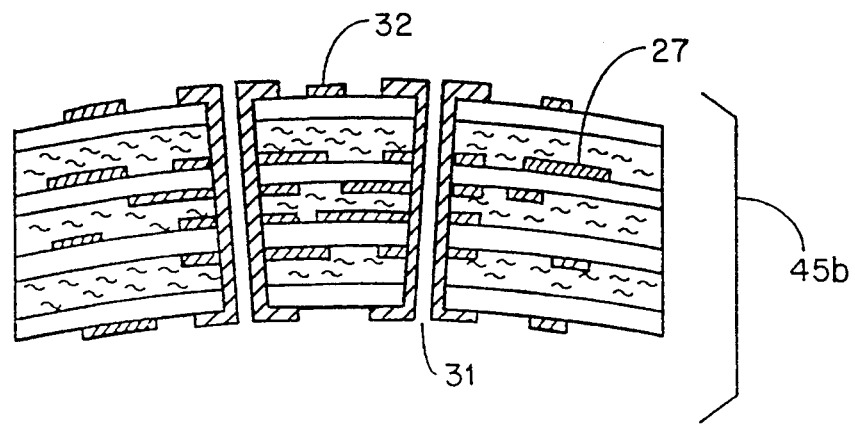

FIG. 18 is a perspective view of a sensitized pattern for confirming the five axis NC data used for laser light exposure of the ninth embodiment of the present invention.

In the first and second embodiments, laser exposure is carried out in the step 209 of FIG. 1 using the five axis NC machine for forming the outer layer patterns on the surface of the curved surface multi-layer wiring board obtained in the through-hole formation step 218 in FIG. 1. In the step 209, if the NC data used for laser exposure are incorrect or have errors, the laser exposure step is carried out in an incorrect way so that the desired outer layer patterns of the curved surface multi-layer wiring board is not obtained. This laser exposure can be carried out for the inner layer patterns in the embodiments 4 to 8. In FIG. 18, before the laser exposure is actually carried out, test patterns of the laser exposure are exposed on a sensitized paper 59 which is set on the installing mould 58. Laser light 52 is exposed on the sensitized paper 59 using the five axis NC machine controlled by the NC data. Then the developing process is carried out. The result of the sensitized pattern (test pattern) 50 indicated on the sensitized paper shows whether errors are included in the NC data or not.

In the above embodiment, the sensitized paper may be substituted by sheets on which many kinds of photosensitivity coating materials are painted.

Tenth Embodiment

Figure 21A:
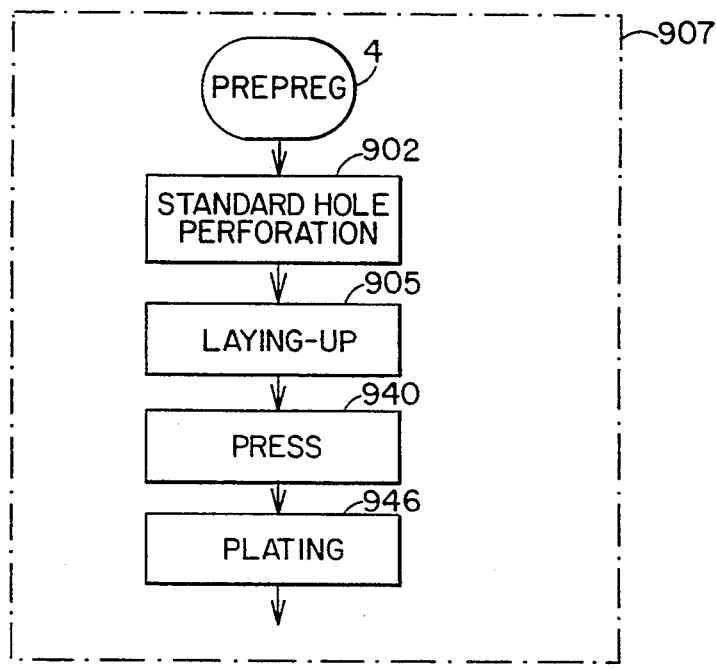
FIGS. 21(a)–21(b) are manufacturing charts of a tenth embodiment of the present invention.

Referring to FIG. 21(a), a basic formation process 907 includes the steps of perforating standard holes (step 902) in a prepreg 4. The prepreg is laid up and and pressed (step 940). The pressing step may be performed by heat pressing or vacuum pressing as discussed above. Next, a copper film is plated on the prepreg (step 946).

Figure 21B:
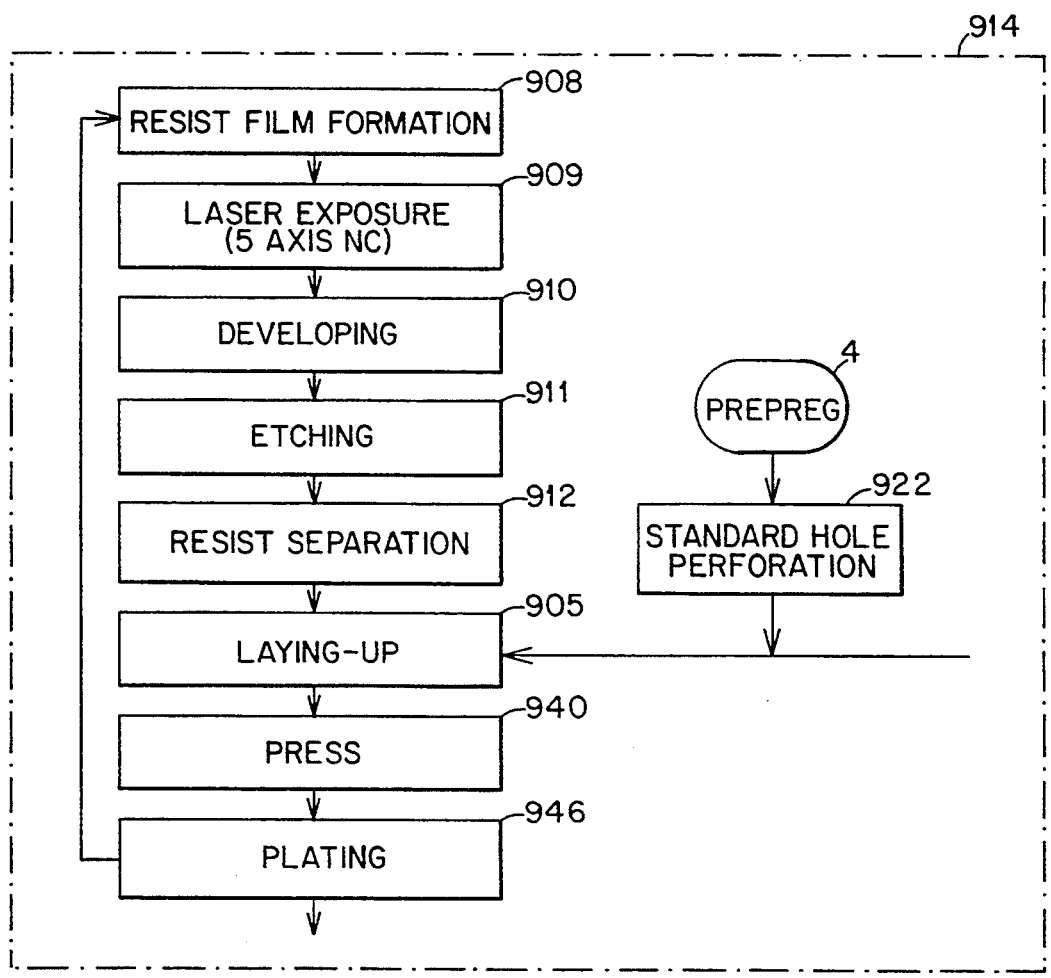

Referring to FIG. 21(b), process 914 includes the steps of resist film formation (step 908), laser exposure (step 909), developing (step 910), etching (step 911), and resist separation (step 912). After the resist separation step, another prepreg has standard holes perforated and is laid up with the first prepreg which has been plated, developed, etched, and resist separated. This forms a new multi-layering wiring board which is pressed (step 940) and again plated (step 946), preferably with a copper film. At this point, the steps of resist film formation, laser exposure, developing, etching, and resist separate can be repeated. The laying up step 905 may be repeated as many times as desired to increase the number of layers in the multi-layer wiring board.

As discussed above, the resist film may be formed on the plated copper film using an electro-deposition resist or splay in the resist film formation step. The resist patterns may be formed by exposing and patterning the light directly on the surface of the curved surface multi-layering wiring board using a five axis numerical control machine in the laser exposure step 909.

By plating the copper film, a curved surface multi-layering wiring board can be manufactured having fewer wrinkles and cracks on the curved surface. In addition, the conductor layers have less copper thickness dispersion and can be used in an arbitrary or three dimensional curve shape, such as a semi-sphere or a portion of a sphere, with a deep drawing or sharp curvature. It should be understood that a plating step could be employed in a number of the other embodiments described above.

Having described a number of embodiments of the present invention, it should be understood that other embodiments and modifications are contemplated as falling within the scope of the present invention as defined by the appended claims.

What is claimed is:

1. A method for manufacturing a curved surface multi-layer wiring board comprising the steps of:
   pressing a prepreg to form a curved surface;
   plating the curved surface of the prepreg with a copper film after the pressing step; and
   forming patterns in the copper film to form a curved surface wiring board.

2. The method of claim 1 wherein the step of forming patterns comprises the steps of:
   forming a resist on the copper film;
   directing laser light to the copper film;
   developing the resist; and
   etching the surface to form patterns.

3. The method of claim 1 further comprising the steps of:
   providing a second prepreg on the curved surface of the curved surface wiring board;
   pressing the second prepreg and the curved surface wiring board to form an outer curved surface;
   plating a second copper film on the outer curved surface; and
   forming patterns on the outer curved surface to form a new curved surface wiring board.

4. The method of claim 3 further comprising the steps of:
   providing a third prepreg on the outer curved surface of the new curved surface wiring board;
   pressing the third prepreg and the new curved surface wiring board to form a next outer curved surface;
   plating a third copper film on the next outer curved surface; and
   forming patterns on the next outer curved surface.

5. The method of claim 4, further comprising the steps of:
   (a) providing a further prepreg over a further outer curved surface:
   (b) plating a further copper film over the further outer curved surface;
   (c) forming patterns on the further outer curved surface; and
   (d) repeating steps (a)–(c) as many times as desired.

6. The method of claim 1 wherein the step of pressing comprises heat pressing in a curved formation mould having heaters at a surface, wherein heat is applied to the formation mould while the prepreg is first being pressed.

7. The method of claim 6, wherein the step of pressing further comprises a step of monitoring the temperature of the mould with sensors at the surface during the pressing step.

8. The method of claim 1 wherein the step of pressing comprises:
   positioning the prepreg in a formation mould in a vacuum chamber; and
   pressing the prepreg in the vacuum chamber.

9. The method of claim 1, wherein the pressing step includes pressing the prepreg to form a three-dimensional curved surface.

10. The method of claim 9, wherein the three-dimensional curved surface is a partial globe.

11. A method for manufacturing a curved surface multilayer wiring board comprising the steps of:
    pressing a prepreg in a curved formation mould to form a curved surface;
    plating a copper film on the curved surface;
    forming patterns in the copper film on the curved surface to form a wiring board;
    providing a second prepreg over the curved surface on which patterns are formed;
    pressing the wiring board and the second prepreg to form a new wiring board with a new curved surface;
    plating a second copper film on the new curved surface;
    forming a resist film on the new curved surface;
    directing laser light to the new curved surface;
    developing the resist; and
    etching the new curved surface to form outer patterns.

12. The method of claim 11 wherein the steps of pressing comprise heat pressings, wherein heat is applied during pressing.

13. The method for manufacturing a curved surface multi-layer wiring board of claim 12, further comprising the step of:
 forming via holes in the wiring board prior to the step of heat pressing the wiring board and the plated prepreg.

14. The method of claim 11, wherein the pressing steps each include pressing to form a three-dimensional curved surface.

15. The method of claim 14, wherein the three-dimensional curved surface is a partial globe.

16. A method for manufacturing a curved surface multilayer wiring board comprising the steps of:
 providing a prepreg with a curved surface;
 plating a copper film on the curved surface;
 forming patterns in the copper film on the curved surface to form a wiring board;
 providing a second prepreg over the curved surface on which patterns are formed;
 pressing the wiring board and the second prepreg to form a new wiring board with a new curved surface;
 plating a second copper film on the new curved surface;
 forming patterns in the second copper film to form a multilayer wiring board.

17. The method of claim 16, further comprising the steps of:
 (a) providing a further prepreg over the new curved surface:
 (b) plating a further copper film over the new curved surface;
 (c) forming patterns on the new curved surface; and
 (d) repeating steps (a)-(c) as many times as desired.

18. The method of claim 16, wherein the pressing step includes pressing the prepreg to form a three-dimensional curved surface.

19. The method of claim 18, wherein the three-dimensional curved surface is a partial globe.

* * * * *